(12) United States Patent
Lau et al.

(10) Patent No.: US 7,436,064 B2
(45) Date of Patent: Oct. 14, 2008

(54) LASER PROCESS FOR RELIABLE AND LOW-RESISTANCE ELECTRICAL CONTACTS

(75) Inventors: Wen Han Lau, Penang (MY); Ian Stephen Millard, Penang (MY)

(73) Assignee: Osram Opto Semiconductors GmbH, Regensburg (DE)

( * ) Notice: Subject to any disclaimer, the term of this patent is extended or adjusted under 35 U.S.C. 154(b) by 284 days.

(21) Appl. No.: 11/412,400

(22) Filed: Apr. 26, 2006

(65) Prior Publication Data
US 2006/0281208 A1    Dec. 14, 2006

Related U.S. Application Data

(60) Provisional application No. 60/674,899, filed on Apr. 26, 2005.

(51) Int. Cl.
*H01L 23/52*    (2006.01)
*H05B 33/06*    (2006.01)

(52) U.S. Cl. .................................... 257/759; 313/512

(58) Field of Classification Search ................. 257/642, 257/759; 313/506, 512; 438/623, 780
See application file for complete search history.

(56) References Cited

U.S. PATENT DOCUMENTS 6,605,826 B2 *    8/2003    Yamazaki et al. ............. 257/72
7,148,624 B2 *   12/2006    Guenther et al. ............. 313/512

* cited by examiner

*Primary Examiner*—Calvin Lee
(74) *Attorney, Agent, or Firm*—Fish & Richardson P.C.

(57) ABSTRACT

Disclosed is a method for manufacturing an organic optoelectronic device. The method comprises providing a substrate, disposing a first electrode on the substrate, disposing a metal pad on the substrate, electrically separated from the first electrode, disposing a first material over the first electrode and at least partially over the metal pad, applying a beam, wherein the beam ablates the first material in an ablation window so that the ablation window includes at least a portion of an edge of the metal pad, and disposing a second electrode over the first material and over the ablation window so that the second electrode is in electrical contact with the at least a portion of an edge of the metal pad.

7 Claims, 6 Drawing Sheets

LASER PROCESS FOR RELIABLE AND LOW-RESISTANCE ELECTRICAL CONTACTS

CROSS-REFERENCE TO RELATED APPLICATIONS

This application claims the benefit of priority of U.S. Provisional Application Ser. No. 60/674,899 filed Apr. 26, 2005, which is incorporated in its entirety by reference for all purposes.

BACKGROUND

This invention relates generally to the art of organic electronic device processing and fabrication. More specifically, the invention relates to the fabrication of organic optoelectronic devices and to organic optoelectronic devices.

A typical structure of an organic optoelectronic device can comprise one or more organic layers, for example electrically conducting layers like hole or electron transportation layers or organic electroluminescent layers that emit electromagnetic radiation. Organic optoelectronic devices further comprise electrode layers like a hole injection electrode layer (anode) and an electron injection electrode layer (cathode). Where the anode, electrically conducting organic layers, organic luminescent layers and cathode overlap form an active region or active area. The electrode layers or electrodes are usually connected to external power supplies or electrical control devices by means of electrical leads. Examples for organic optoelectronic devices are an organic radiation emitting, electroluminescent device, commonly known as organic light-emitting diode ("OLED"), an organic radiation-detecting device, or an organic thin-film-transistor ("OTFT") device.

There is a need to provide a reliable process in mass production for connections of the electrodes to external power supplies or electrical control devices via electrical leads with uniform and low electrical contact resistance.

SUMMARY

In at least one embodiment, a method for manufacturing an organic optoelectronic device is disclosed, wherein the method comprises the following steps:

providing a substrate;

disposing a first electrode on the substrate;

disposing a metal pad on the substrate, electrically separated from the first electrode;

disposing at least a first material over the first electrode and at least partially over the metal pad;

applying a beam, wherein the beam ablates the first material in an ablation window, the ablation window including at least a portion of an edge of the metal pad; and disposing a second electrode over the first material and over the ablation window so that the second electrode is in electrical contact with the at least a portion of an edge of the metal pad.

In another embodiment, a method for providing electrical contact to an electrode of an organic light emitting diode device is described. The method includes providing a metal pad for connection to said electrode, the pad being disposed on a substrate. A layer is disposed over the substrate, the layer having an ablation window through which at least part of an edge portion of the metal pad is exposed. A conductive material is disposed on the substrate and in the ablation window so that the conductive material is in electrical contact with the metal pad.

In at least one embodiment, the ablation window is formed in the area where first material is ablated. The ablation window may be the area where first material is completely ablated and which is free of first material after the ablation process.

A metal pad that is disposed on the substrate can include metal-pad material, such as a conductive material, for example copper, chromium or a combination of copper and chromium. In particular, the metal pad may be made of metal pad that includes only copper or chromium or an alloy or a mixture of copper and chromium.

In at least one embodiment, a metal pad is formed in such a way that the metal pad has a shape with a higher circumference-to-surface ratio than the geometrical basic shape that forms the basis for the shape of the metal pad. A geometrical basic shape that forms the basis for the shape of the metal pad may be a square, a rectangle, a triangle, a hexagon, a circle, or an ellipse, or any other basic geometrical shape. The length of the edges of the metal pad may define the circumference of the metal pad. The area which is covered by metal-pad material may define the surface of the metal pad.

In at least one embodiment, the step of disposing a first electrode on the substrate includes disposing exactly one first electrode on the substrate and the step of disposing a second electrode over the first material includes disposing exactly one second electrode over the first material.

In one or more embodiments, what is disclosed is the ablation of a metal pad to expose a contact whereby the ablation window includes or overlaps at least part of one or more edges of the metal pad. In a preferred embodiment, the area impacted by a laser beam performing the ablation overlaps the end of each metal pad. An overlap of the laser ablated area with metal edges at any point along the metal pad is desirable. In alternate embodiments, the metal pads can be patterned with a shape such that the ablation window includes or overlaps at least one edge of the metal pad. The metal pad is used to connect to a cathode or other electrode of the OLED device.

Further advantages and preferred embodiments of the invention are disclosed in the following according to the embodiments described with the figures.

DETAILED DESCRIPTION

Figure 1A:
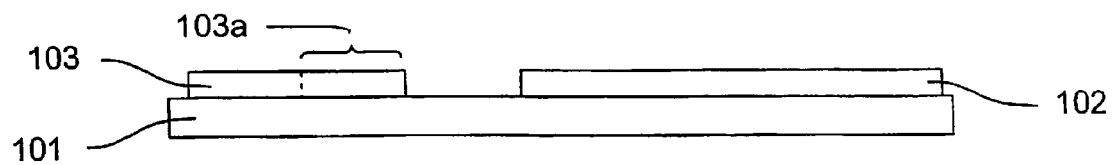
FIGS. 1A to 1D show different steps of a method for manufacturing an organic optoelectronic device according to at least one embodiment.

In the embodiment according to FIG. 1A, a first step of a manufacturing method of an organic optoelectronic device is shown. On the substrate 101 a first electrode layer 102 is disposed which can be formed as a single electrode. Alternatively, the first electrode can be structured forming several electrodes, preferably in a stripe-like shape, which can be arranged for instance in a row-like pattern. Furthermore, a metal pad 103 is disposed on the substrate 101. The metal pad 103 is disposed on the substrate 101 in such way that there is no electrical contact between the metal pad 103 and the first electrode 102. The metal pad 103 can be formed as a single metal pad, or alternatively, the metal pad 103 can be structured to form a plurality of several metal pads. The metal pad can be made of a material comprising at least one of Copper (Cu), Chromium (Cr) or a combination thereof. If the organic optoelectronic device to be manufactured is an OLED, the substrate can be transparent and further can be flexible or rigid. Furthermore, the first electrode can comprise ITO and thus can be transparent. The metal pad additionally can comprise the different shapes described above or which will be described in the FIGS. 5A to 5L, for example the holes, indentations and/or convexities. These irregular shapes are preferably located in the area 103A of the metal pad 103.

Figure 1B:
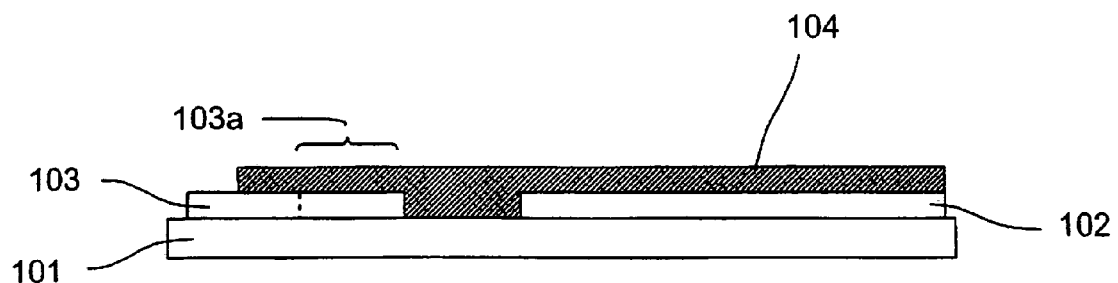

In a further step of the method as shown in FIG. 1B, first material 104 is disposed over the first electrode 102 and at least partially over the metal pad 103. The layer of the first material also covers the area 103A of the metal pad 103. As shown in FIG. 1B the first material can include at least one layer of material comprising organic material. Apart from the layer of first material 104 shown in FIG. 1B, more functional organic layers, such as a layer of second material and even more layers forming functional layers of the organic optoelectronic device can be deposited. The first material 104 can be disposed over the first electrode 102 and at least partially over the metal pad in an unstructured way, for example by spin-coating or vapor deposition. Using this technique, a homogeneous layer or several homogeneous layers of functional organic material can be deposited.

Alternatively or in addition, the step shown in FIG. 1B includes the deposition of insulating material as first material 104 over the first electrode and at least partially over the metal pad 103. The insulating material can be disposed in a structured way so that the insulating material has windows free of the insulating material over the first electrode (not shown). In a further step, organic material can be disposed either only in the windows of the insulating material or in an unstructured manner over the insulating material.

Figure 1C:
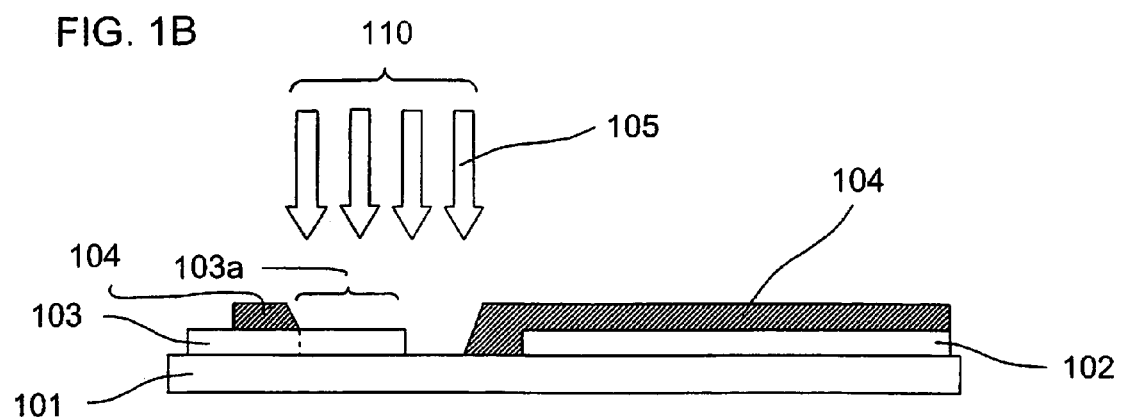

According to FIG. 1C, in a further step of the method a beam 105, which is preferably a laser beam, is applied to the first material 104. The laser beam 105 is absorbed by the first material 104 and causes the first material to be ablated in the region where the beam is applied. The area 110, in which the first material is completely ablated and thus removed from the substrate and from the metal pad, defines the ablation window. This ablation can also uncover the region 103A of the metal pad. During the ablation process, a laser beam 105 can be applied which is of the same size as the ablation window. In this case, the size of the laser beam 105 is determined by the emission characteristics of the laser, by optical means such as lenses, or by apertures such as an opening in a mask, or by combinations thereof. The size of the laser beam 105 can be larger than the ablation window 110 and therefore the laser beam 105 can be applied through a mask (not shown). The ablation window can be a rectangle with a size of 100 micrometers in length and 50 micrometers in width. If the first material is organic material, a KrF-excimer laser emitting ultraviolet radiation can be used. The ablation window 110 is arranged over the metal pad 103 in such a way that at least a portion of an edge of the metal pad 103 is exposed by the ablation process, because the ablation process removes first material over a portion of the edge of the metal pad 103.

Figure 1D:
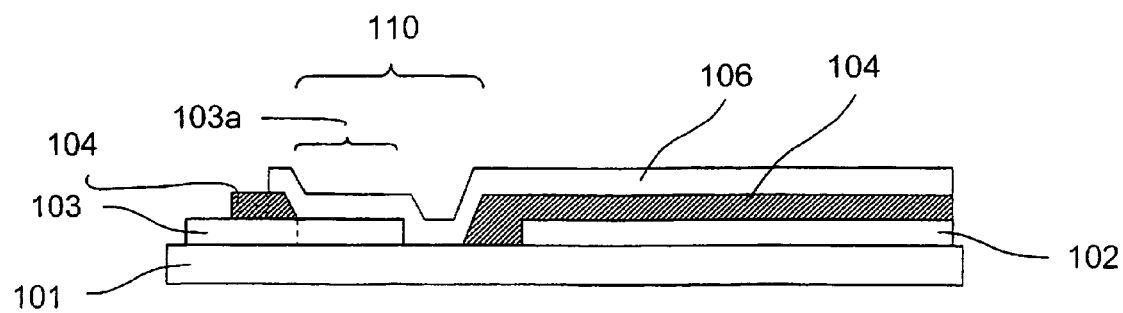

In a further step of the method according to FIG. 1D, after ablation of the first material, a second electrode 106 is disposed over the first material 104 and over the metal pad 103 in such a way that the second electrode 106 is, after the deposition, in electrical contact with at least a portion of an edge of the metal pad, preferably the area 103A. The second electrode can be formed as a single electrode, or alternatively, the second electrode can be structured forming several electrodes, such as in a stripe-like shape, which can be arranged, for example, in a column-like pattern.

The metal pad can be connected to an electrical lead in order to electrically connect the metal pad and therefore also the second electrode to an external power supply or to an electronic control unit. The power supply or the electronic control unit can be used to apply a voltage and/or an electrical current to the second electrode. Similarly, the first electrode can be connected to an electrical lead, either directly or also via a metal pad, in order to electrically connect the first electrode to the power supply or to the electronic control unit. The electronic control unit can be any suitable electronic circuit as for example a voltage supply, a current supply, an amplifier, a transimpedance amplifier such as a current-to-voltage converter, or any combination thereof.

In at least one embodiment, the beam which ablates the first material in the ablation window is a light beam, such as a laser beam. The laser beam can be collimated or uncollimated, further the laser beam can be focused or defocused. The shape of the laser beam or the shape of the projection of the laser beam on the substrate can be circular, elliptical, line-shaped, or any other suitable or desired shape.

The laser beam can be absorbed by the first material thus removing first material during an ablation process, for example by heating and evaporating the first material. The laser beam can comprise any suitable wavelength from ultraviolet to infrared light. In at least one embodiment, the laser comprises ultraviolet light in the range of 150 to 300 nanometers, such as in the range of 198 to 248 nanometers. In at least one embodiment of the invention the laser is an excimer laser, such as a KrF-excimer laser.

Furthermore, the laser beam can comprise radiation with several wavelengths. This can be advantageous if the first material includes different materials with different absorption properties. For example the first material can comprise several layers including different materials, respectively. Then a layer of the first material can be ablated by a first wavelength of the laser beam and another layer of the first material can by ablated by a second wavelength of the laser beam.

In at least one embodiment the size of the ablation window is equal to the size of the beam. In particular, the ablation window can have a shape that is provided by the shape of the beam. This means in particular that the laser beam can be applied to the first material while being kept in a static position with respect to the substrate.

In at least one embodiment, the size of the beam is smaller than the ablation window. This means that the beam can be moved during the ablation of the first material, while the substrate is fixed. The beam can be moved by any suitable mechanical or optical means such as, mirrors, lenses, or translation stages. Alternatively, the substrate can be moved during the ablation process, for instance by a mechanical translation stage, so that the beam is effectively moved with respect to the substrate. Alternatively, both the beam and the substrate can be moved with respect to each other.

In at least one embodiment, of the size of the beam is larger than the ablation window. This means that in at least one embodiment at least part of first material that is located in the area where the beam is applied is not or not completely ablated by the beam so that after the ablation process at least part of the first material can remain on the substrate in the area where the beam was applied. For example, the intensity profile of the beam can be not homogeneous over the size of the beam but the beam intensity can, for example, decrease from the center to the edges of the beam. Due to the higher intensity of the beam in the center of the beam, first material which is located in the center of the beam can be ablated faster than first material that is located close to the edges of the beam. Depending on the duration of the ablation process only first material near the center of the beam can be ablated whereas first material close to the edges of the beam can remain on the substrate.

In at least one further embodiment, the beam can be applied through a mask having at least one opening, the mask being equal in size to the ablation window. The mask can be used when the size of the beam is larger than the desired ablation window or if the shape of the beam deviates from the desired shape of the ablation window. A mask having at least one opening through which the beam is applied can result in any desired shape of ablation window from the ablation process. Preferred shapes of the at least one opening of the mask can be line-shaped, circular, elliptical, rectangular, squared, or any other suitable shape or a combination thereof. It can also be advantageous if the beam is applied through a mask having several openings in order to ablate first material in several ablation windows at the same time.

In at least one embodiment, the ablation window has a rectangular shape with a length of 100 micrometers and a width of 50 micrometers.

In at least one embodiment, disposing a first material over the first electrode and at least partially over the metal pad includes disposing an organic material. The step of disposing a first material can include disposing a stack of several layers of organic material over the first electrode, where the several layers have similar or different functionalities, respectively. The organic material can fulfill at least one of the functions of electron injection, hole injection, electron transportation, hole transportation, light-emitting, or light-absorbing, or a suitable combination thereof. Preferably the first material can be disposed as an unstructured, continuous layer. The first material can form at least one of an electron injection layer, a hole injection layer, an electron transportation layer, a hole transportation layer, a light-emitting layer, or a light-detecting layer. For example, if the organic optoelectronic device is an OLED, the first material can comprise a hole transportation layer and a light-emitting layer or a hole transportation layer, a light-emitting layer, and an electron transportation layer.

The organic material can comprise at least one of organic monomers, organic oligomers, organic polymers, and organic small molecules. Furthermore, if the first material includes several layers of organic materials, the several layers can include similar or different organic materials. For example, if the organic optoelectronic device is an OLED including several functional layers, all functional layers can comprise organic polymers.

The first material can be disposed over the first electrode and at least partially over the metal pad by any suitable technique. The first material can be applied in a layer-wise manner over the metal pad. The first material can include organic polymers and can be disposed by means of spin coating, or organic small molecules, which can be disposed by thermal evaporation.

In at least one embodiment, the first material comprises an insulating material which is disposed over the first electrode and at least partially over the metal pad. The insulating material can be formed as a structured layer over the first electrode in such a way that the structured layer includes windows which are free of insulating material. In such windows, which are free of insulating material, in a further step organic material in form of one or several functional layers can be disposed by means of an unselective or a selective deposition technique as ink-jet printing. The windows can, for example, define functional units of the organic optoelectronic device, for instance pixels or sub-pixels of an OLED. The first material can comprise organic or inorganic insulating material.

Alternatively, the first material can include at least one layer of insulating material and at least one layer of organic material. The insulating material can be preferably structured to form a structured layer over the first electrode in such a way that the insulating material includes windows which are free of insulating material over the first electrode. The organic material can be disposed over the insulating material and over the windows forming a continuous layer or also a structured layer.

The insulating material can for example comprise insulating polymers, disposed as a continuous layer and afterwards structured so that the insulating layer includes windows over the first electrodes. Alternatively, the insulating material can be selectively disposed to form windows over the first electrode. Furthermore, the insulating material can be disposed as a foil. For example the insulating material can comprise polysiloxanes.

In a further embodiment, an additional second material might disposed at least partially over the metal pad. In this case the beam can additionally ablate the second material in the ablation window. The second material can also form a layer, which can comprise the same or different material as the first material. For example the first material can include at least one layer of insulating material and the second material can include at least one layer of organic material or vice versa.

In at least one embodiment, the step of disposing a metal pad comprises disposing multiple metal pads. The number of metal pads can be equal to the number of second electrodes.

In at least one embodiment, the substrate comprises glass, quartz, plastic, metal, silicon or any other suitable material. The substrate can be transparent to light or can be opaque. Further, the substrate can be flexible or non-flexible. A flexible substrate can comprise a very thin glass sheet, a plastic foil or a metal foil. The dimensions of the substrate can reach from millimeters to centimeters or even larger.

In at least one embodiment, the term "light" relates to electromagnetic radiation with a wavelength or a range of wavelengths, the wavelength or the range of wavelengths falling into a range of wavelengths which comprises ultraviolet, visible, and infrared electromagnetic radiation. Furthermore, the term "transparent for light" can characterize a material which is transparent for light comprising a certain wavelength or a range of wavelengths. In this sense a material which is transparent for light can be transparent for one wavelength but can be opaque for another wavelength.

In at least one further embodiment, the step of disposing a first electrode on the substrate comprises disposing multiple first electrodes on the substrate. Further, the step of disposing a second electrode over the first material can comprise disposing multiple second electrodes over the first material. The multiple first electrodes can be electrically separated from each other. Further, the multiple second electrodes can also be electrically separated from each other.

In at least one embodiment, the multiple first electrodes and the multiple second electrodes are structured in stripe-like patterns. The multiple first electrodes and the multiple second electrodes can be parallel to each other so that each first electrode of the multiple first electrodes together with one second electrode of the multiple second electrodes forms a pair of electrodes. The multiple first electrodes, being structured in a stripe-like pattern, can also be arranged in rows on the substrate and the multiple second electrodes, being structured in a stripe-like pattern, can be arranged in columns over the material so that the multiple first electrodes are arranged to be perpendicular to the multiple second electrodes. This can form, for example, an organic electroluminescent device comprising several pixels or sub-pixels, each pixel or sub-pixel defined by the crossing area of one of the several first electrodes and one of the several second electrodes. Such a device might be a display or can be used for lighting purposes.

In further embodiments, a first electrode or a second electrode or both can be patterned in any desired shape such as square-shaped, rectangular-shaped, triangular-shaped, hexagonal-shaped, circular-shaped, elliptical-shaped, or any combination thereof. In particular an electrode, which can be a first or a second electrode, can be formed in a stripe-like shape with regularly arranged regions, the regions having a certain shape, where the shape can be the shape of a square, a rectangle, a triangle, a hexagon, a circle, an ellipse, or any combination thereof.

In at least one embodiment, a first electrode that is disposed on the substrate is transparent for light. In particular, if the organic optoelectronic device is an OLED comprising an organic electroluminescent layer, the first electrode can be transparent for at least part of the light emitted by the organic electroluminescent layer. The first electrode can preferably comprise a transparent anode material as for example a transparent conductive oxide ("TCO") such as indium tin oxide ("ITO"), indium zinc oxide, cadmium oxide, titanium oxide, tin oxide, or zinc oxide, or any other suitable binary or ternary metal oxide compound. Furthermore, a second electrode can comprise a cathode. A suitable cathode material can be aluminum, barium, indium, silver, gold, magnesium, calcium, or lithium or combinations, alloys, or compounds thereof. Alternatively or additionally, the second electrode can be transparent to light.

In at least one embodiment, a first electrode comprises a cathode and a second electrode comprises an anode.

Figure 2:
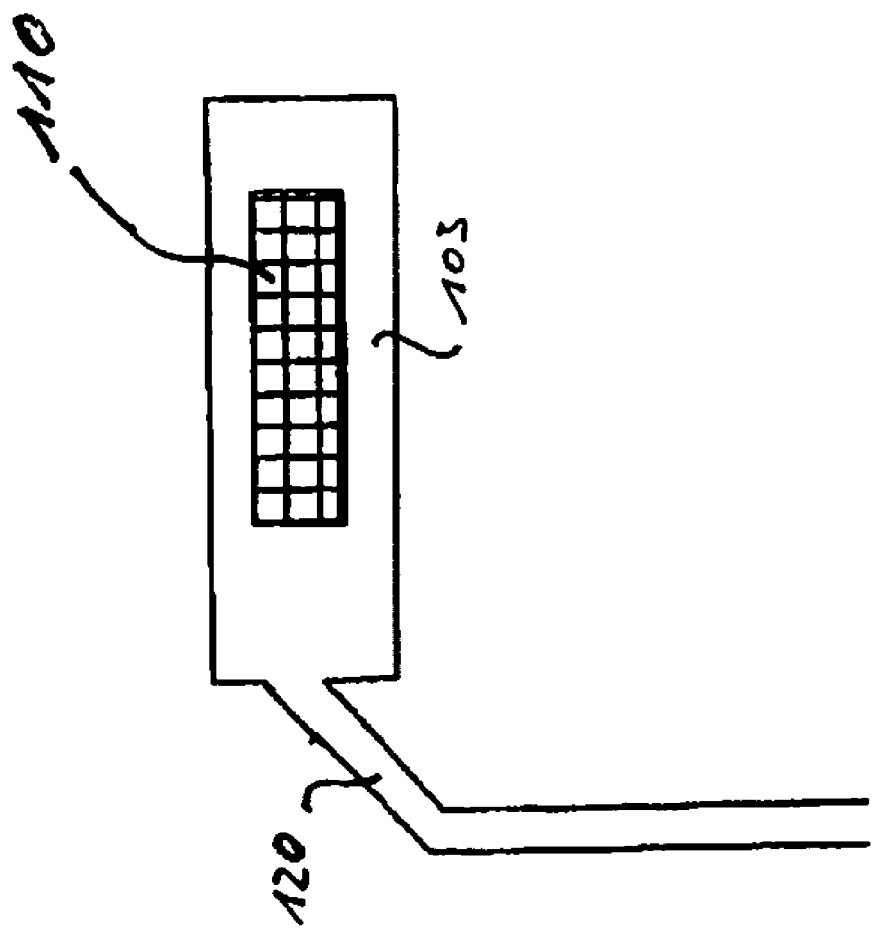
FIG. 2 shows an example for an arrangement of the ablation window over the metal pad.

FIG. 2 shows an arrangement of an ablation window 110 over a metal pad 103. Also shown is the electrical lead 120 which contacts the metal pad 103 to an external power supply.

Figure 3:
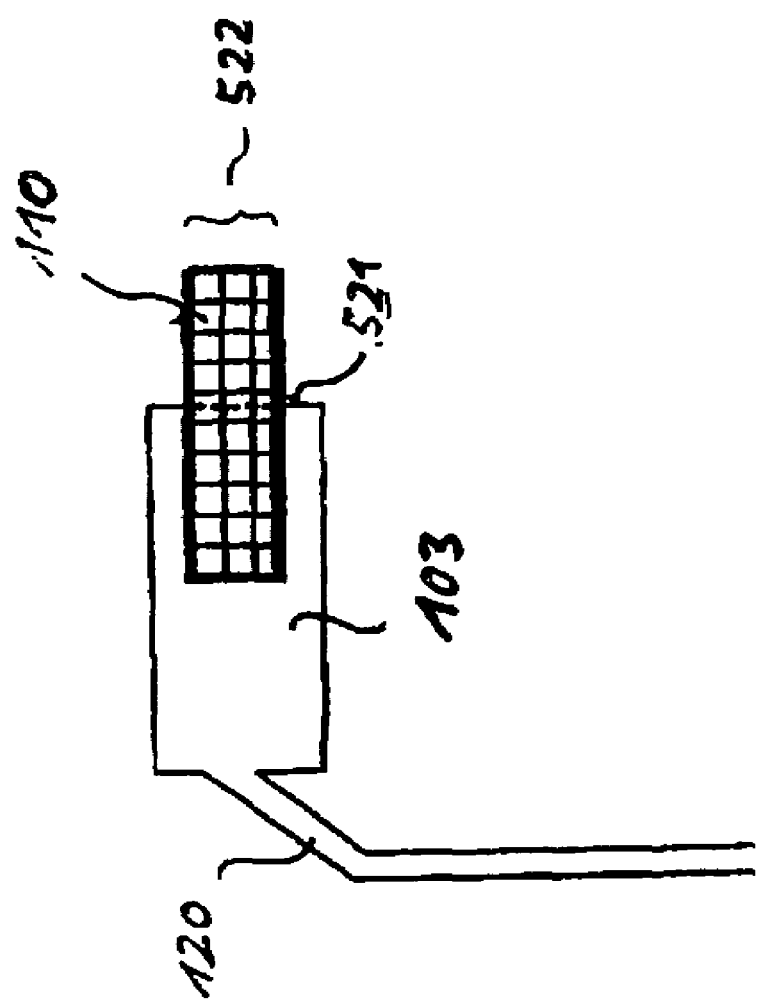
FIG. 3 shows a further example for an arrangement of the ablation window over the metal pad.

FIG. 3 shows as an embodiment of the invention an arrangement of the ablation window 110 over the metal pad 103. The metal pad can be electrically connected for example to an electrical power supply via the electrical lead 120. The ablation window is arranged in such a way that portion 522 of the edge 521 of the metal pad 103 is in the ablation window 110. This means that the portion 522 of the edge 521 of the metal pad 103 can be in electrical contact with a second electrode after the second electrode is deposited over the ablation window.

A metal pad can be disposed in such a way that the metal pad comprises an area which is free of metal-pad material and which is enclosed by metal-pad material. This can imply that after being disposed on the substrate the metal pad comprises at least one hole, which can be of any desired shape, such as a square, a rectangle, a triangle, a hexagon, a circle, or an ellipse, or any combination thereof. The metal pad can comprise more than one hole where the several holes can be of the same size or of different sizes and where the several holes can be of the same shape or of different shapes. A geometrical basic shape with at least one hole is an example for a shape with a higher circumference-to-surface ratio than the geometrical basic shape itself. It can be advantageous if at least a part of the edge of the hole of the metal pad is free of first material after ablating the first material. This means that the organic optoelectronic device can include a metal pad with a hole, an area of the metal pad being free of the first material including at least a portion of an edge of the hole, and the metal pad being in electrical contact with the second electrode in such a way that the at least a portion of an edge of the hole of the metal pad is in electrical contact with the second electrode.

Figure 4:
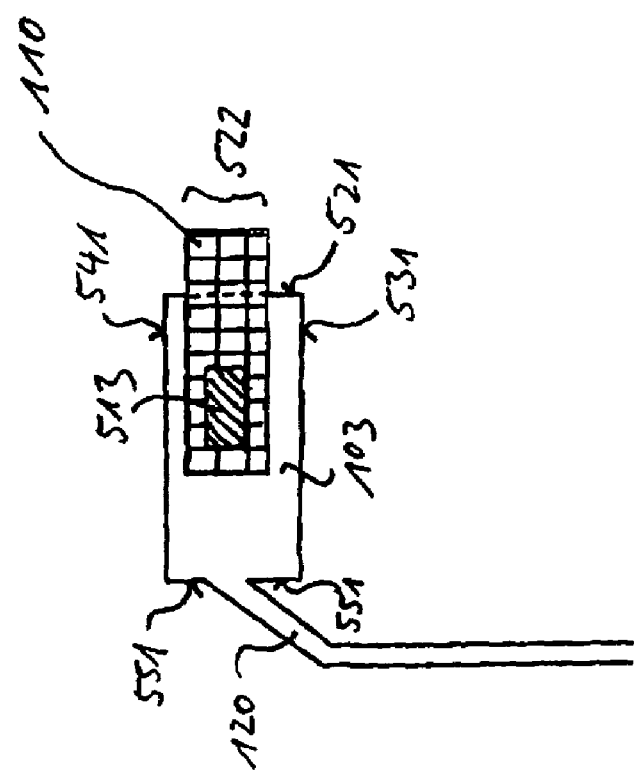
FIG. 4 shows a further example for an arrangement of the ablation window over the metal pad.

The embodiment according to FIG. 4 shows a metal pad 103 which includes a hole 513, which is free of metal pad material. This hole 513 can be away from the outer edges 521, 531, 541, and 551 of the metal pad or can be coincident with or touching at least one of the outer edges of the metal pad. In some embodiments, the size of the metal pad can be made shorter so that the laser does not move towards the active areas of the device (not shown). The ablation window 110 is arranged in such a way that it overlaps the portion 522 of the edge 521 of the metal pad 103 as well as the hole 513 of the metal pad 103. Therefore the ablation window overlaps also the edge of the hole 513. This means that the portion of an edge of the metal pad 103 that is included in the ablation window 110 is increased in comparison to the embodiment according to FIG. 3. The embodiment shown in FIG. 4 can be advantageous as it can provide an even lower variance in electrical resistance between similar organic optoelectronic devices in mass production.

In FIGS. 5A to 5L various embodiments are shown according to various arrangements of ablation windows over metal pads of different shapes and sizes. Therefore, in FIGS. 5A to 5L all other parts of organic optoelectronic devices such as the substrate, the first and the second electrode and the first material are not shown.

Figure 5A:
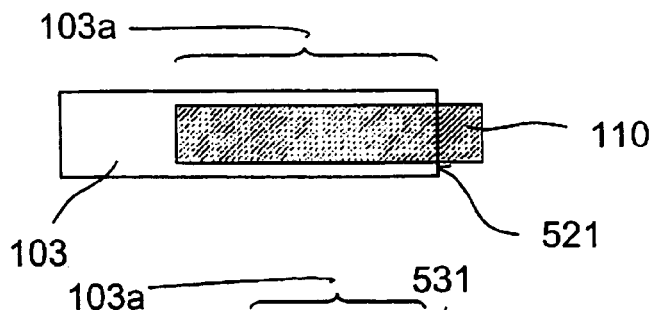
FIGS. 5A to 5L show examples for different shapes, sizes, and arrangements of ablation windows over metal pads, respectively.
Figure 5B:
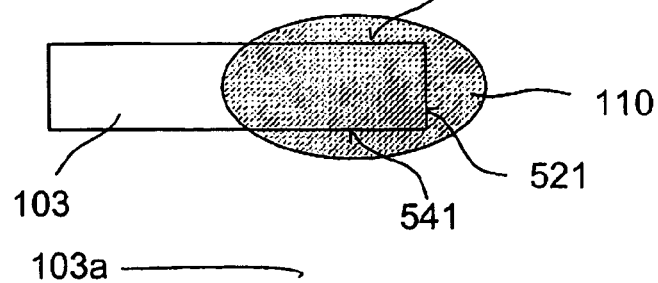
Figure 5C:
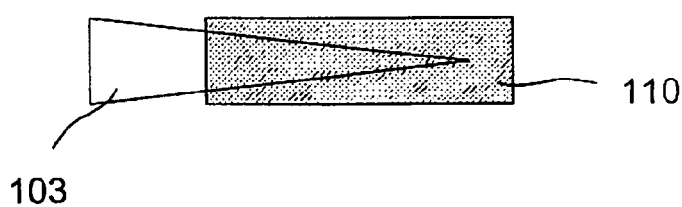

FIGS. 5A to 5C show embodiments of arrangements where the ablation window 110 is arranged over the metal pad 103, where metal pads 103 and ablation windows 110 have geometrical basic shapes and where the ablation windows include at least portion of an edge of the metal pads 103. According to the embodiment of FIG. 5A it can be advantageous if both the metal pad 103 and the ablation window 110 are rectangular. As shown in this particular embodiment, the ablation window 110 is narrower than the metal pad 103 so that only part of edge 521 is included in the ablation window. Alternatively, the ablation window 110 can be broader than the metal pad 103 so that more edges or more portions of edges of the metal pad 103 are included in the ablation window. In particular, in FIG. 5B an embodiment is shown where the ablation window 110 has the shape of an ellipse which is arranged over the metal pad 103 in such a way that edge 521 and portions of edges 531 and 541 are included in the ablation window. An elliptical shape of the ablation window 110 can be advantageous if, for instance, a laser beam with an elliptical beam shape of the particular size is used in the ablation step. FIG. 5C shows in a further embodiment an arrangement of a rectangular-shaped ablation window 110 over a triangular-shaped metal pad 103.

Figure 5D:
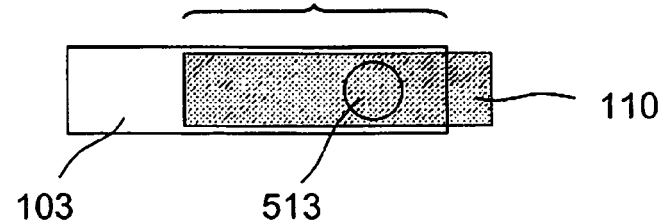
Figure 5E:
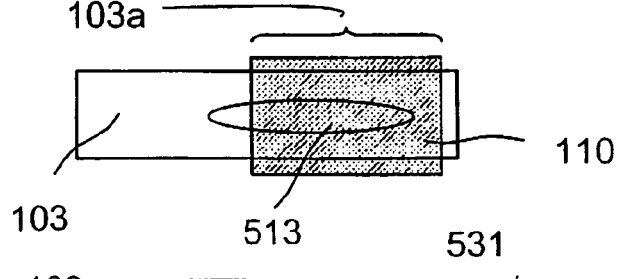
Figure 5F:
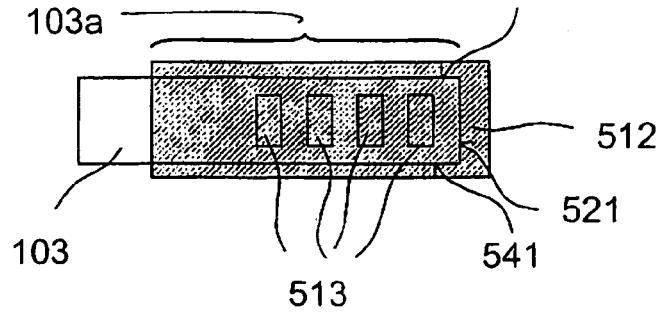

FIGS. 5D to 5F show several embodiments of arrangements of metal pads 103 and ablation windows 110 where the metal pads 103 have at least one hole 513 being free of metal-pad material. The embodiment according to FIG. 5D is a variation of the embodiment according to FIG. 5A where because of the hole 513, the circumference-to-surface ratio of the metal pad 103 is increased, in particular because of the portion of edges which are included in the ablation window. FIG. 5E shows a further embodiment of an arrangement of an ablation window 110 over a metal pad 103 with a hole 513, the ablation window 110 including different portions of edges of the metal pad 103 compared to the embodiment according to FIG. 5D. The embodiment according to FIG. 5F shows a metal pad 103 with several holes 513, at least portions of edges 521, 531, and 541 included in the ablation window 110 as well as the edges of the holes 513. Due to the increased circumference-to-surface ratio of the metal pad 103, the length of the portions of edges of the metal pad 103 which are included in the ablation window are increased compared to the above-mentioned embodiments.

Furthermore, a metal pad can be disposed on the substrate so that after being disposed, the metal pad comprises at least part of an edge having at least one indentation. An indentation can be an area which is partly enclosed by metal-pad material and which can have any desired shape such as at least part of a square, a rectangular, a triangle, a hexagon, a circle, an ellipse, or any other shape or any combination thereof. After disposing a metal pad on the substrate, the metal pad can comprise more than one indentation, for example at least one indentation on more than one edge, respectively, or more than one indentation on the same edge, or a combination thereof. It can be especially preferably if the metal pad has an edge with a toothed structure, i.e. a regular or a non-regular series of indentations comprising the same of different shapes and sizes. In particular, at least part of the edge of the indentation or of the more than one indentations can be free of first material and, if present, second material after the ablation of the first and/or second material. This means that the organic optoelectronic device can include a metal pad with at least one indentation, an area of the metal pad being free of the first material including at least a portion of an edge of the at least one indentation, and the metal pad being in electrical contact with the second electrode in such a way that at least a portion of the at least one indentation is in electrical contact with the second electrode.

In some embodiments, a metal pad is disposed on the substrate so that after the disposing the metal pad comprises at least part of an edge with at least one convexity. This implies that, for example, a metal pad having a basic geometrical shape with only straight edges, i.e. for example a square, a rectangle, a triangle, or a hexagon, can have at least part of an edge which has a convex structure. Such a convexity can lead to a shape with a higher circumference-to-surface ratio than the basic geometrical shape. After disposing a metal pad on the substrate, the metal pad can comprise more than one convexity, for example at least one convexity on more than one edge, respectively, or more than one convexity on the same edge. In particular, at least part of the edge of the convexity or of the more than one convexity can be free of first material and, if present, second material after ablation of the first and/or second material. This means that the organic optoelectronic device can include a metal pad with at least one convexity, an area of the metal pad being free of the first material including at least a portion of an edge of the at least one convexity, and the metal pad being in electrical contact with the second electrode in such a way that at least a portion of the at least one convexity is in electrical contact with the second electrode. The metal pad can also include any combination of the different shapes described above, for example combinations of holes, indentations and convexities.

The embodiments according to FIGS. 5G to 5L show arrangements of metal pads 103 and ablation windows 110, where the metal pads having convexities 514 and/or indentations 515.

Figure 5G:
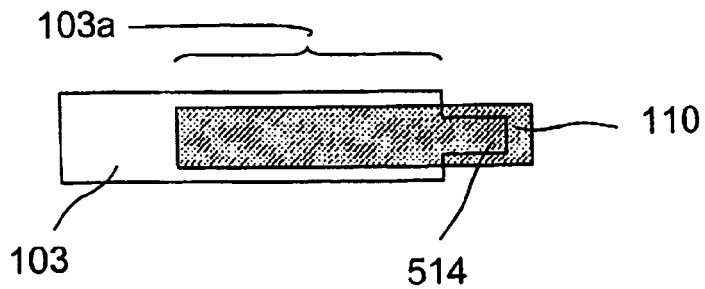
Figure 5H:
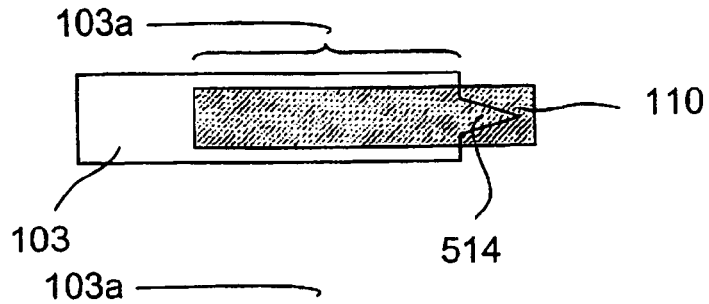
Figure 5I:
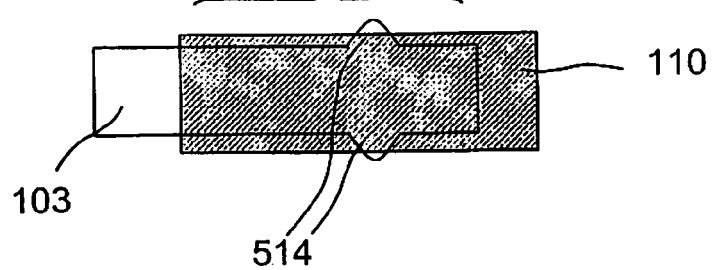

FIGS. 5G to 5I show embodiments of metal pads 103 with various convexities with different shapes. It can be advantageous if the ablation window 110 includes at least a portion of the edge of the metal pad 103 having a portion of the edge of a convexity 514, which increases the length of the edge which is included in the ablation window 110. Convexities 514 can be on only one side of the metal pad 103 as shown in FIGS. 5G and 5H or can be on more than one side, for example on opposite sides as shown in FIG. 5I.

Figure 5J:
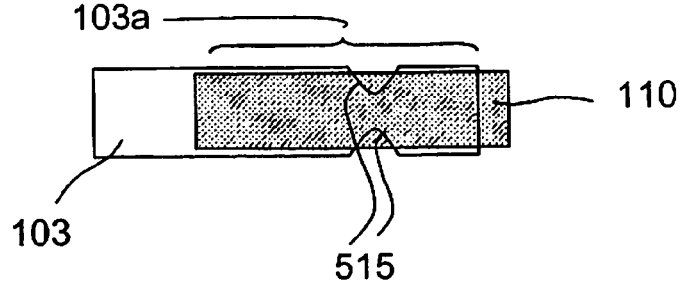

FIG. 5J shows in a further embodiment an arrangement of a metal pad 103 with indentations 515 on opposite sides of the metal pad 103. Alternatively, the metal pad 103 can have only one indentation on one side (not shown).

Figure 5K:
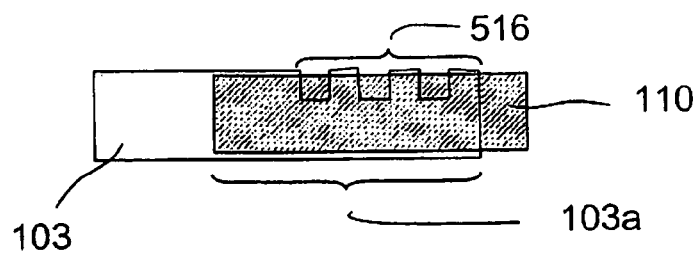

FIG. 5K shows an embodiment of a metal pad 103 with a region 516 on one edge where the region 516 includes indentations that form a toothed structure in the edge. Due to the toothed structured, the length of the edge which is included in the ablation window 110 is significantly increased without changing the surface of the metal pad significantly.

Figure 5L:
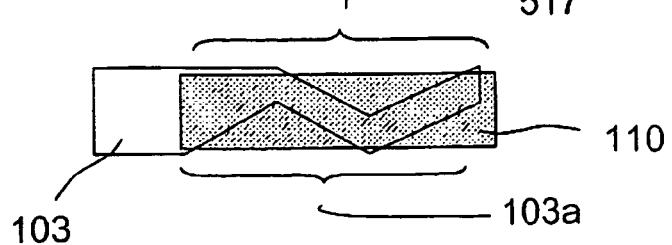

The embodiment of FIG. 5L shows a metal pad 103 having a combination of indentations and convexities so that the metal pad 103 appears to have a zigzag-like shape included in the ablation window 110.

The embodiments shown in FIGS. 5A to 5L are rather exemplary and any other combination of metal-pad shapes and ablation-window shapes is also disclosed, in particular metal pads having combinations of holes, indentations, and convexities, at least portions of the edges of the holes, indentations, and/or convexities included in the ablation window.

It was found that the disclosed method of manufacturing an organic optoelectronic device can be advantageous regarding the electrical contact between the metal pad and the second electrode. It can be especially advantageous that at least a portion of an edge of the metal pad is in electrical contact with the second electrode. In order to increase the fraction of edges in the area where the metal pad is in electrical contact with the second electrode, holes, indentations and/or convexities can be formed in the metal pad. For example, if several similar contacts between several pairs of metal pads with second electrodes, respectively, are to be established, it was found that the method given above yields a low variance in the contact resistance of the several pairs, respectively. In particular, in mass production of a great amount of similar organic optoelectronic devices with electrical connections between a metal pad and a second electrode, a low variance in the contact resistance results in a more reliable production process and in a lower variance of the properties of the similar organic optoelectronic devices, respectively. The same advantage can apply also to an organic optoelectronic device which comprises several metal pads which are in electrical contact with several second electrodes, respectively. This reduced variation in resistance translates into better row to row uniformity in luminance across an OLED display, the OLED display comprising several columns of first electrodes and several rows of second electrodes perpendicular to the first electrodes, the crossing areas of the first and second electrodes defining the pixels of the display, which can be visibly confirmed.

The lower variance in electrical resistance between the metal pad and the second electrode may directly relate in OLEDs to a lower luminance variance for similar devices or different active areas of the same OLED.

The reduction in luminance variation which can be observed with metal pad edge ablation can occur for a variety of reasons. One possible reason is that the ablation at the edge of the metal pad allows a better electrical contact possibly through:

thinner polymer;
better second electrode, e.g. cathode, physical contact;
reduced heat dissipation; and/or
ablation contacting ITO surface.

The improvement could also be due to the pad being moved towards the active area where there would be less polymer pile up and thus making easier the ablation process. Of course, other reasons for reduction in luminance variation can also exist.

What is claimed is:

1. An organic optoelectronic device, comprising:
   a substrate;
   a first electrode on the substrate;
   a metal pad on the substrate, electrically separated from the first electrode, the metal pad including a metal pad region where the metal pad has a shape with a higher circumference-to-surface ratio than the geometrical basic shape from which the shape of the metal pad is derived;
   a first material over the first electrode and at least partially over the metal pad, wherein an area of the metal pad is free of the first material, the area including at least a portion of an edge of the metal pad; and
   a second electrode over the first material, the second electrode being in electrical contact with the portion of an edge of the metal pad in the metal pad region.

2. The device according to claim 1, wherein the metal pad comprises an area which is free of metal-pad material and which is enclosed by metal-pad material.

3. The device according to claim 1, wherein the area which is free of metal-pad material is a hole, the hole having a circular, an elliptical, a triangular, a rectangular, or a squared shape or a combination thereof, and the area of the metal pad which is free of the first material includes at least a portion of an edge of the hole.

4. The device according to claim 1, wherein the metal pad has at least one edge with at least one indentation, the area of the metal pad which is free of the first material including at least a portion of an edge of the indentation.

5. The device according to claim 1, wherein the metal pad has at least one edge with at least one convexity, the area of the metal pad which is free of the first material including at least a portion of an edge of the convexity.

6. The device according to claim 1, wherein the metal pad has at least one edge with a toothed structure, the area of the metal pad which is free of the first material including at least a portion of an edge of the toothed structure.

7. The device according to claim 1, wherein the basic geometrical shape is one of a circular, an elliptical, a triangular, a rectangular or a squared shape or a combination thereof.

* * * * *